United States Patent
Fan et al.

(10) Patent No.: US 6,834,013 B2
(45) Date of Patent: Dec. 21, 2004

(54) METHOD FOR PROGRAMMING AND ERASING NON-VOLATILE MEMORY WITH NITRIDE TUNNELING LAYER

(75) Inventors: Tso-Hung Fan, Taipei Hsien (TW); Yen-Hung Yeh, Taoyuan Hsien (TW); Kwang-Yang Chan, Hsinchu (TW); Mu-Yi Liu, Taichung (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/015,414

(22) Filed: Dec. 12, 2001

(65) Prior Publication Data

US 2003/0103383 A1 Jun. 5, 2003

(30) Foreign Application Priority Data

Dec. 4, 2001 (TW) ........................................ 90129931 A

(51) Int. Cl.$^7$ ........................... G11C 16/04; G11C 5/06; G06F 12/00
(52) U.S. Cl. ........................ 365/185.29; 365/185.18; 365/72; 711/103
(58) Field of Search .................... 365/185.18, 72, 365/185.28; 711/103

(56) References Cited

U.S. PATENT DOCUMENTS

| | | | | |
|---|---|---|---|---|
| 4,353,083 A | * | 10/1982 | Trudel et al. ................ | 257/326 |
| 4,635,229 A | * | 1/1987 | Okumura et al. ......... | 365/185.07 |
| 5,493,141 A | * | 2/1996 | Ricco et al. ................. | 257/321 |
| 5,739,569 A | * | 4/1998 | Chen ........................... | 257/321 |
| 6,005,809 A | * | 12/1999 | Sung et al. ............. | 365/185.29 |
| 6,327,187 B1 | * | 12/2001 | Bergemont et al. ..... | 365/185.28 |
| 6,418,040 B1 | * | 7/2002 | Meng ........................... | 363/60 |
| 6,426,897 B1 | * | 7/2002 | Jung et al. .............. | 365/185.29 |
| 6,436,768 B1 | * | 8/2002 | Yang et al. .................. | 438/266 |
| 6,445,030 B1 | * | 9/2002 | Wu et al. .................... | 257/315 |
| 6,448,137 B1 | * | 9/2002 | Lai et al. ..................... | 438/258 |
| 6,465,306 B1 | * | 10/2002 | Ramsbey et al. ........... | 438/279 |
| 2002/0032891 A1 | * | 3/2002 | Yada et al. .................. | 714/766 |
| 2002/0060929 A1 | * | 5/2002 | Choi ...................... | 365/185.29 |
| 2003/0067807 A1 | * | 4/2003 | Lin et al. ............... | 365/185.28 |
| 2003/0067809 A1 | * | 4/2003 | Wooldridge ........... | 365/185.29 |
| 2003/0128591 A1 | * | 7/2003 | Mihnea et al. ......... | 365/185.29 |

FOREIGN PATENT DOCUMENTS

JP    2001229683 A  * 8/2001  ........... G11C/16/02

* cited by examiner

Primary Examiner—David Nelms
Assistant Examiner—Ly Duy Pham
(74) Attorney, Agent, or Firm—J.C. Patents

(57) ABSTRACT

A method for programming and erasing a non-volatile memory with a nitride tunneling layer is described. The non-volatile memory is programmed by applying a first voltage to the gate and grounding the substrate to turn on a channel between the source and the drain, and applying a second voltage to the drain and grounding the source to induce a current in the channel and thereby to generate hot electrons therein. The hot electrons are injected into a charge-trapping layer of the non-volatile and trapped therein through the nitride tunneling layer. The non-volatile memory is erased by applying a first positive bias to the drain, applying a second positive bias to the gate, and grounding the source and the substrate to generate hot electron holes in the channel region. The hot electron holes are injected into the charge-trapping layer through the nitride tunneling layer.

6 Claims, 2 Drawing Sheets

METHOD FOR PROGRAMMING AND ERASING NON-VOLATILE MEMORY WITH NITRIDE TUNNELING LAYER

CROSS-REFERENCE TO RELATED APPLICATION

This application claims the priority benefit of Taiwan application serial no. 90129931, filed Dec. 4, 2001.

BACKGROUND OF THE INVENTION

1. Field of Invention

The present invention relates to a method for programming and erasing a non-volatile memory. More particularly, the present invention relates to a method for programming and erasing a non-volatile memory with a nitride tunneling layer.

2. Description of Related Art

The family of the non-volatile memory includes the erasable programmable read-only memory (EPROM) and the electrically erasable programmable read-only memory ($E^2$PROM). Particularly, the $E^2$PROM can be erased and programmed electrically and is capable of retaining data even if the power is turned off, and therefore is widely used in personal computers and in electronic apparatuses.

The $E^2$PROM with a silicon oxide/silicon nitride/silicon oxide (ONO) stacked structure is recently developed, which includes the Silicon-Oxide-Nitride-Oxide-Silicon (SONOS) memory and the nitride read-only memory (NROM). By comparing with the conventional non-volatile memory having a doped polysilicon floating gate, the SONOS memory uses lower voltages for its operation and therefore can be easily scaled down for a higher integration. On the other hand, the NROM is able to prevent a leakage and to store two bits in one memory cell, and therefore has a better performance. A typical NROM is capable of preventing a leakage is because the injected electrons are localized in certain regions in the silicon nitride charge trapping layer. These injected electrons are less likely to locate on the defects in the tunnel oxide layer that would otherwise cause a leakage.

However, since the SONOS memory and the NROM both use silicon oxide as the material of the tunneling layer, the following problems are encountered.

Since silicon oxide has a high energy barrier for an electron and an electron hole, the efficiency of hot carrier (electron or electron hole) injection through the tunnel oxide layer is low when the channel hot carrier injection mechanism is used to program or to erase the SONOS or NROM device. Thus the rates of the programming operation and the erasing operation of the memory device are lowered.

SUMMARY OF THE INVENTION

Accordingly, this invention provides a method for programming and erasing a non-volatile memory with a nitride tunneling layer, which can promote the efficiency of a programming operation or an erasing operation of a memory device.

The method for programming a non-volatile memory with a nitride tunneling layer of this invention comprises the following steps. The gate of the non-volatile memory is applied with a first voltage and the substrate is grounded to turn on the channel between the source and the drain. The drain is applied with a second voltage and the source is grounded to induce a current in a channel and thereby generate hot electrons therein. The hot electrons are injected into a charge-trapping layer of the non-volatile memory and trapped therein through the nitride tunneling layer.

The method for erasing a non-volatile memory with a nitride tunneling layer of this invention comprises the following steps. The drain is applied with a first positive bias, the gate is applied with a second positive bias, and the substrate and the source are both grounded to generate hot electron holes in the channel region. The hot electron holes are injected into the charge-trapping layer through the nitride tunneling layer and are recombined with the electrons therein to complete the erasing operation.

Moreover, in the method for programming and erasing a non-volatile memory with a nitride tunneling layer of this invention, the first voltage, the second voltage, the first positive bias, and the second positive bias mentioned above are all lower than those used in the operation of the SONOS memory of the same size.

Since the tunneling layer in this invention is made from silicon nitride that has a energy barrier lower than that of silicon oxide used in the prior art, the efficiency of the channel hot carrier injection can be promoted and the operating rates of the memory device are thus increased.

Besides, since the dielectric constant of silicon nitride is higher than that of silicon oxide, lower operating voltages can be used to program or to erase the nonvolatile memory with a nitride tunneling layer. Therefore, the critical dimension and the size of a memory cell can be further reduced for a higher integration.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1 schematically illustrates a non-volatile memory with a nitride tunneling layer according to a preferred embodiment of this invention in a cross-sectional view.

DESCRIPTION OF THE PREFERRED EMBODIMENTS

Figure 1:
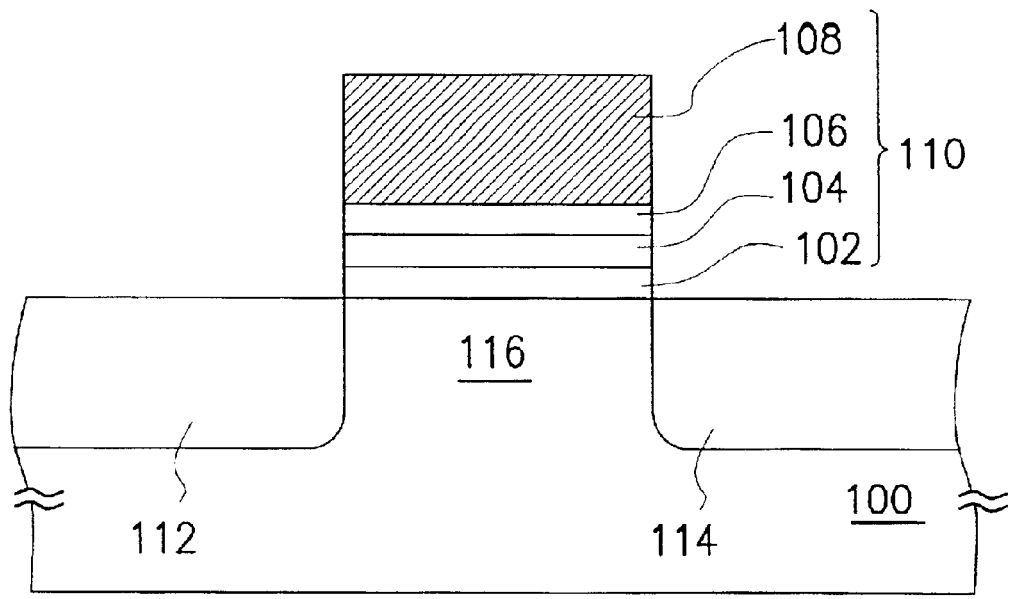

FIG. 1 schematically illustrates a non-volatile memory with a nitride tunneling layer according to a preferred embodiment of this invention in a cross-sectional view.

Refer to FIG. 1, the non-volatile memory with a nitride tunneling layer comprises a substrate 100, a nitride tunneling layer 102, a charge-trapping layer 104, a dielectric layer 106, a gate conductive layer 108, a source region 112, a drain region 114, and a channel region 116.

The substrate 100 comprises, for example, silicon. The substrate 100 is of n-type (p-type) when the non-volatile memory to be formed is a p-channel (n-channel) memory.

The nitride tunneling layer 102 is disposed on the substrate 100. The nitride tunneling layer 102 is formed by, for example, chemical vapor deposition (CVD).

The charge-trapping layer 104 is disposed on the nitride tunneling layer 102. The material of the charge-trapping layer 104a is, for example, silicon nitride and the method for forming the charge-trapping layer 104a is, for example, chemical vapor deposition (CVD).

The dielectric layer 106 is formed on the charge-trapping layer 104. The dielectric layer 106 is formed from, for example, silicon oxide and is formed by, for example, chemical vapor deposition (CVD).

The gate conductive layer 108 is disposed on the dielectric layer 106. The gate conductive layer 108 comprises, for example, polysilicon and is formed by a method such as chemical vapor deposition. Besides, the gate conductive layer 108, the nitride tunneling layer 102, the charge-trapping layer 104, and the dielectric layer 106 together construct a stacked gate structure 110.

The source region 112 and the drain region 114 are formed in the substrate 100 beside the gate structure 110. The source/drain region 112/114 has a conductive type different from that of the substrate 100, i.e., the source/drain region 112/114 is of p-type (n-type) when the substrate 100 is of n-type (p-type).

The channel region 116 is located in the substrate 100 under the gate structure 110 and between the source region 112 and the drain region 114.

Figure 2:
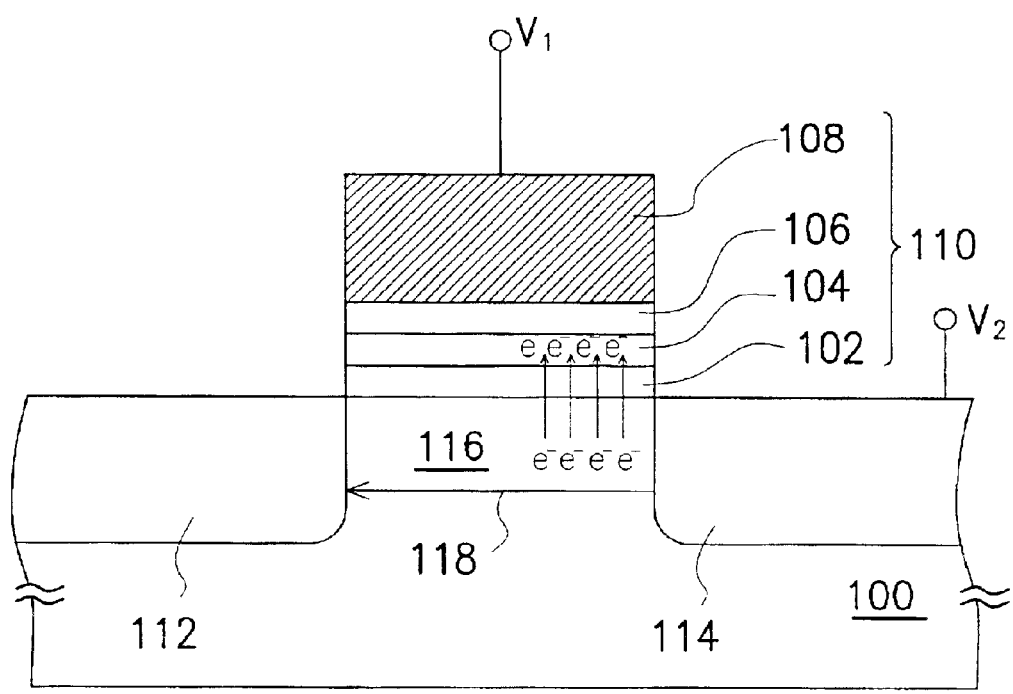
FIG. 2 schematically illustrates the method for programming a nonvolatile memory with a nitride tunneling layer according to the preferred embodiment of this invention, and FIG. 3 schematically illustrates the method for erasing a non-volatile memory with a nitride tunneling layer according to the preferred embodiment of this invention.

FIG. 2 schematically illustrates the method for programming a nonvolatile memory with a nitride tunneling layer according to the preferred embodiment of this invention.

Refer to FIG. 2, when the non-volatile memory with a nitride tunneling layer is to be programmed, the gate 110 is applied with a first voltage $V_1$ and the substrate 100 is grounded to turn on the channel 116 between the source 112 and the drain 114, wherein the first voltage $V_1$ ranges from about 6V to about 12V. Meanwhile, the drain region 114 is applied with a second voltage $V_2$ ranging from about 2.5V to about 5V and the source region 112 is grounded to induce a current 118 in the channel region 116 and thereby generate hot electrons. The hot electrons are injected into the charge-trapping layer 104 through the nitride tunneling layer 102 because of the attraction of the gate conductive layer 108 at a higher voltage level.

Figure 3:
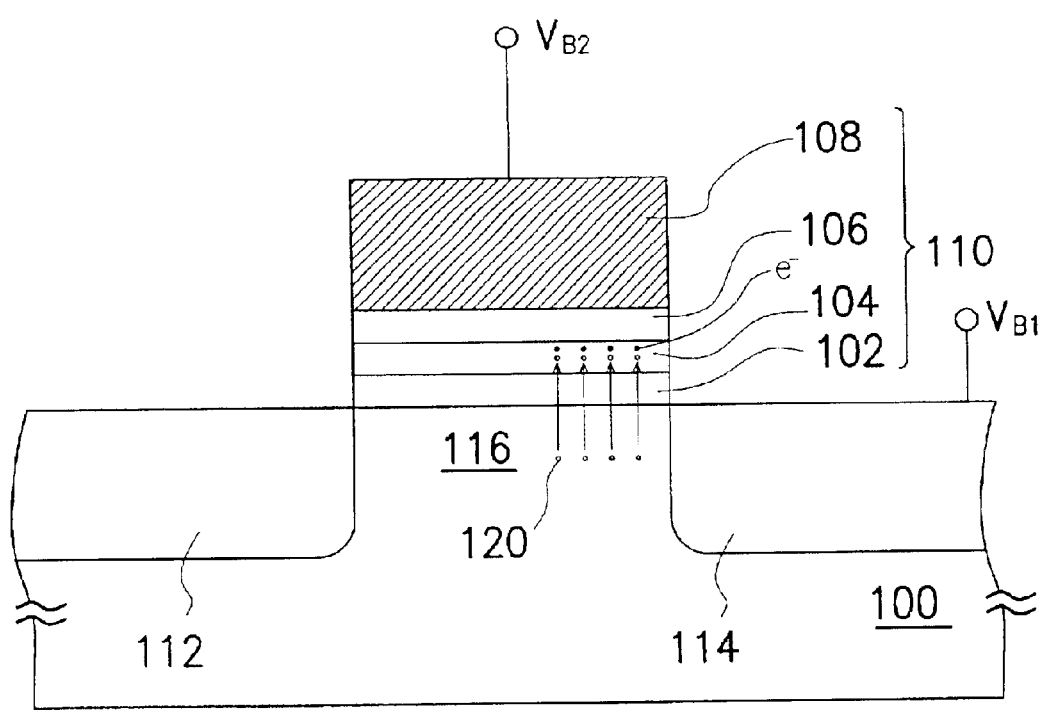

FIG. 3 schematically illustrates the method for erasing a non-volatile memory with a nitride tunneling layer according to the preferred embodiment of this invention.

Refer to FIG. 3, when the non-volatile memory with a nitride tunneling layer is to be erased, the drain region 114 is applied with a first positive bias $V_{B1}$, the gate conductive layer 108 is applied with a second positive bias $VB_2$, and the source region 112 and the substrate 100 are both grounded to generate hot electron holes in the channel region 116, wherein the first positive bias $V_{B1}$ ranges from about 2V to about 5V and the second positive bias $V_{B2}$ ranges from about 2.5V to about 5V. The hot electron holes are injected into the charge-trapping layer 104 through the nitride tunneling layer 102.

Moreover, in the method for programming and erasing a non-volatile memory with a nitride tunneling layer according to the preferred embodiment of this invention, the first voltage $V_1$, the second voltage $V_2$, the first positive bias $V_{B1}$, and the second positive bias $V_{B2}$ mentioned above are all lower than those used in the operation of the SONOS memory of the same size.

Besides, since the dielectric constant of silicon nitride is higher than that of silicon oxide, lower operating voltages can be used to program or erase the nonvolatile memory with a nitride tunneling layer. Therefore, the critical dimension and the size of a memory cell can be further reduced for a higher integration.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of erasing a non-volatile memory cell with a nitride tunneling layer, comprising:

providing a non-volatile memory cell comprising a substrate, a nitride tunneling layer disposed on the substrate, a charge trapping layer having hot electrons and disposed on the nitride tunneling layer, a dielectric layer disposed on the charge-trapping layer, a gate conductive layer disposed on the dielectric layer, a source region and a drain region disposed in the substrate adjacent to the nitride tunneling layer;

applying a first positive bias to the drain region;

applying a second positive bias to the gate conductive layer; and grounding the source region and the substrate;

wherein the first positive bias and the second positive bias are both sufficient to inject hot electron holes into the charge-trapping layer through the nitride tunneling layer to combine with hot electrons in the charge-trapping layer for erasing the non-volatile memory cell.

2. The method of claim 1, wherein the first positive bias ranges from about 2V to about 5V.

3. The method of claim 1, wherein the second positive bias ranges from about 2.5V to about 5V.

4. A method of erasing a non-volatile memory cell with a nitride tunneling layer, comprising:

providing a non-volatile memory cell comprising a substrate, a nitride tunneling layer disposed on the substrate, a charge-trapping layer having hot electrons and disposed on and in direct contact with the nitride tunneling layer, a dielectric layer disposed on the charge-trapping layer, a gate conductive layer disposed on the dielectric layer, a source region and a drain region disposed in the substrate adjacent to the nitride tunneling layer;

applying a first positive bias to the drain region;

applying a second positive bias to the gate conductive layer; and grounding the source region and the substrate;

wherein the first positive bias and the second positive bias are both sufficient to inject hot electron holes into the charge-trapping layer through the nitride tunneling layer to combine with hot electrons in the charge-trapping layer for erasing the non-volatile memory cell.

5. The method of claim 4, wherein the first positive bias ranges from about 2V to about 5V.

6. The method of claim 4, wherein the second positive bias ranges from about 2.5V to about 5V.

* * * * *